US005932826A

United States Patent [19]
Kosugi

[11] Patent Number: 5,932,826

[45] Date of Patent: Aug. 3, 1999

[54] EFFECT ADDER CIRCUIT WITH A COEFFICIENT SMOOTHING CIRCUIT FOR AN ELECTRONIC MUSICAL INSTRUMENT

[75] Inventor: Taichi Kosugi, Hamamatsu, Japan

[73] Assignee: Kabushiki Kaisha Kawai Gakkiseisakusho, Shizuoka-ken, Japan

[21] Appl. No.: 09/084,420

[22] Filed: May 27, 1998

[30] Foreign Application Priority Data

May 27, 1997 [JP] Japan .................................... 9-152844

[51] Int. Cl.[6] ................................ G10H 1/02; H03G 3/00

[52] U.S. Cl. ................................................ 84/626; 381/61

[58] Field of Search .................... 84/604–608, 622–633; 381/61–65

[56] References Cited

U.S. PATENT DOCUMENTS 5,173,567 12/1992 Fujita ........................................ 84/607
5,241,124 8/1993 Adachi et al. ............................ 84/607
5,340,940 8/1994 Iizuka et al. .......................... 84/622 X
5,357,575 10/1994 Kitamura .............................. 84/604 X

*Primary Examiner*—Stanley J. Witkowski

[57] ABSTRACT

An electronic musical instrument has an effect adder circuit for adding sound effect which is controlled by coefficients for filtering operations and amplitude control. The instrument also has a smoothing circuit for smoothly changing a coefficient to a target value by interpolating between the coefficient current value and the coefficient target value to be updated. Smoothing is implemented by repeatedly adding or subtracting a given value to or from the coefficient current value until it reaches the coefficient target value. The precision of the smoothing coefficient depends on the word length of the coefficient current value so that the word length of the coefficient target value can be smaller than that of the coefficient current value. The effect adder circuit and smoothing circuit are independently provided to operate in parallel.

26 Claims, 3 Drawing Sheets

EFFECT ADDER CIRCUIT WITH A COEFFICIENT SMOOTHING CIRCUIT FOR AN ELECTRONIC MUSICAL INSTRUMENT

BACKGROUND OF THE INVENTION

1. Field of the Invention

The present invention relates to an effect adder apparatus for an electronic musical instrument and, more particularly, to an apparatus suitably used for adding acoustic effects to an input tone signal.

2. Description of the Prior Art

In a conventional electronic musical instrument, addition of various acoustic effects such as reverberation, chorus, and the like can give profoundness and depth to tones like in acoustic musical instruments, and such effects are important factors in colorful musical expressions. In an electronic musical Instrument which adds acoustic effects by a microprocessor-controlled effect adder circuit controlled by a microprocessor (CPU), various effects are added to the input tone signal by predetermined operations using various coefficients.

Various coefficients used in operations for effect addition are stored in a coefficient memory in the effect adder circuit. Some of these coefficients have fixed values from the very beginning of power ON, but some other coefficients must be updated in accordance with player's panel operations, program, or the like during processing of the tone signal. In such case, if the coefficient to be updated is abruptly changed to a new value, the output signals before and after the change become discontinuous, and click noise is unwantedly produced upon switching.

To prevent such problem, the CPU smoothes the coefficient to be updated, and gradually transfers new coefficient values obtained by smoothing to the coefficient memory in the effect adder circuit. However, this processing imposes a heavy processing load on the CPU, and may delay other processing operations (keyboard processing, panel processing, and the like) that the CPU must perform. Conversely, when the processing load on the CPU is to be reduced, a lower smoothing precision must be inevitably set, resulting in generation of click noises.

In order to solve the above problems, the coefficient is smoothed by using fundamental operation circuits in the effect adder circuit in place of the CPU. However, in this case smoothing wastes hardware resources for implementing effect addition, resulting in deterioration of effect addition quality.

SUMMARY OF THE INVENTION

The present invention has been made to solve such problems, and has as its object to provide a low-cost effect adder device, which can smooth effect addition coefficients with high resolution without increasing the processing load of the CPU or deteriorating the quality of effect addition.

An effect adder apparatus for an electronic musical instrument according to the present invention is characterized by comprising a first storage means for storing current values of coefficients used in an effect addition operation, an operation unit for implementing the effect addition operation using the coefficient current value stored in the first storage, a second storage for storing coefficient target values each having a word length shorter than a word length of the coefficient current value stored in the first storage, the second storage storing the same number of words as in the first storage, and a coefficient smoothing unit, arranged independently of the operation unit, for smoothing the coefficient current value stored in the first storage toward the coefficient target value stored in the second storage.

As another feature of the present invention, the apparatus further comprises a smoothing disable unit for disabling smoothing of the coefficient by the coefficient smoothing unit.

The second storage may further store disable information for instructing disabling of smoothing in units of coefficients, and the smoothing disable unit may disable smoothing of the coefficient by the coefficient smoothing unit when the disable information is active.

The effect addition operation may be controlled by a microprogram, and addresses of the first and second storages unit may be designated by the microprogram, and the smoothing disable unit may disable smoothing of the coefficient by the coefficient smoothing means in accordance with an instruction of the microprogram when the microprogram designates the addresses of the first and second storages.

The second storage may further store disable information for instructing disabling of smoothing in units of coefficients, the effect addition operation may be controlled by a microprogram, and addresses of the first and second storages may be designated by the microprogram, and the smoothing disable unit may disable smoothing of the coefficient by the coefficient smoothing unit in accordance with at least one of the disable information in an active state and an instruction of the microprogram when the microprogram designates the addresses of the first and second storages.

As still another feature of the present invention, the smoothing disable unit is controlled to disable coefficient smoothing after an elapse of a predetermined period of time from the beginning of the coefficient smoothing by the coefficient smoothing unit.

As yet another feature of the present invention, three patterns including enable of coefficient smoothing, disable of smoothing, and a combination of enable and disable of smoothing are selectively used in accordance with a type of coefficient.

DESCRIPTION OF THE PREFERRED EMBODIMENTS

An embodiment of the present invention will be described hereinafter with reference to the accompanying drawings.

Figure 1:
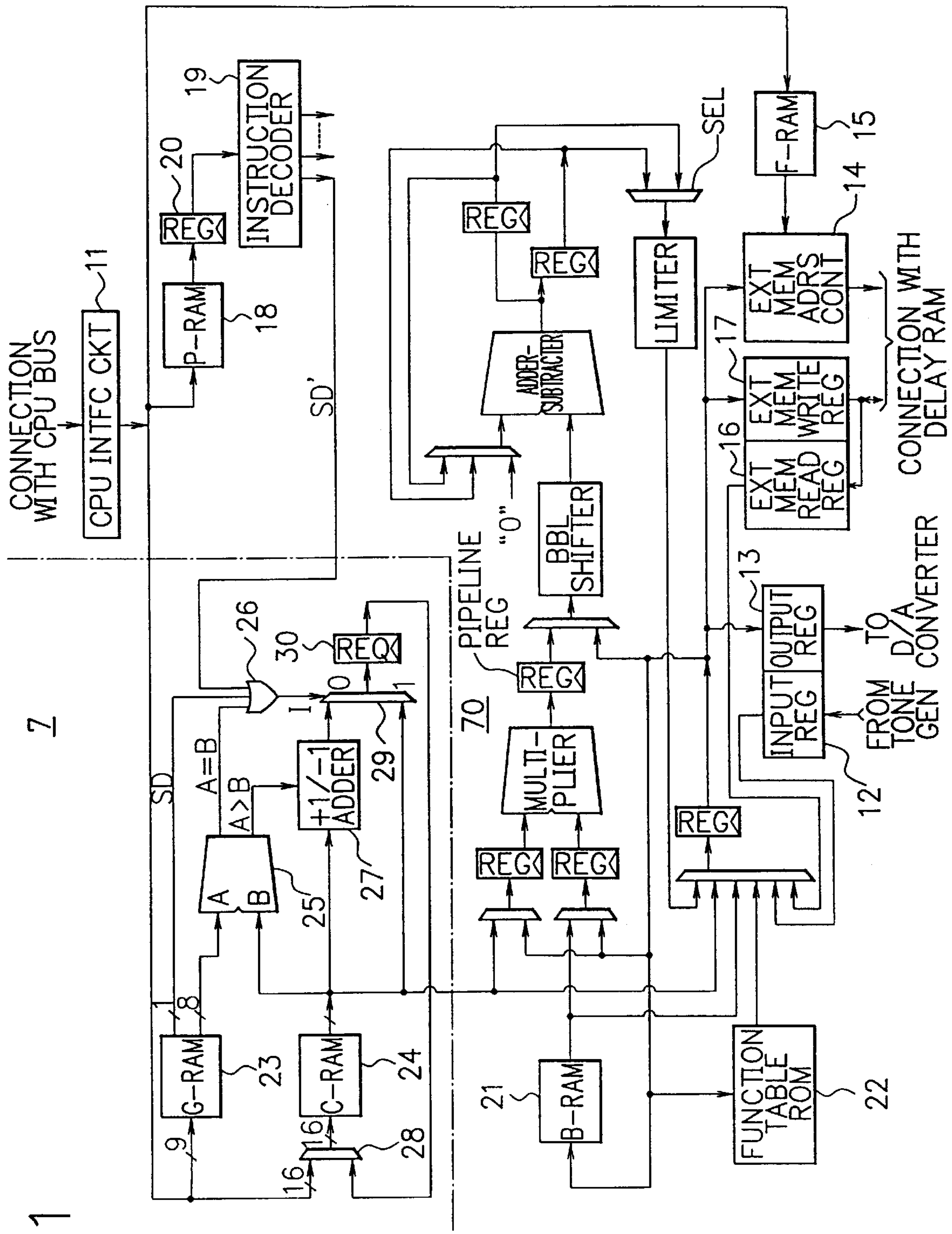
FIG. 1 is a block diagram showing the arrangement of an effect adder circuit according to an embodiment of the present invention.
Figure 2:
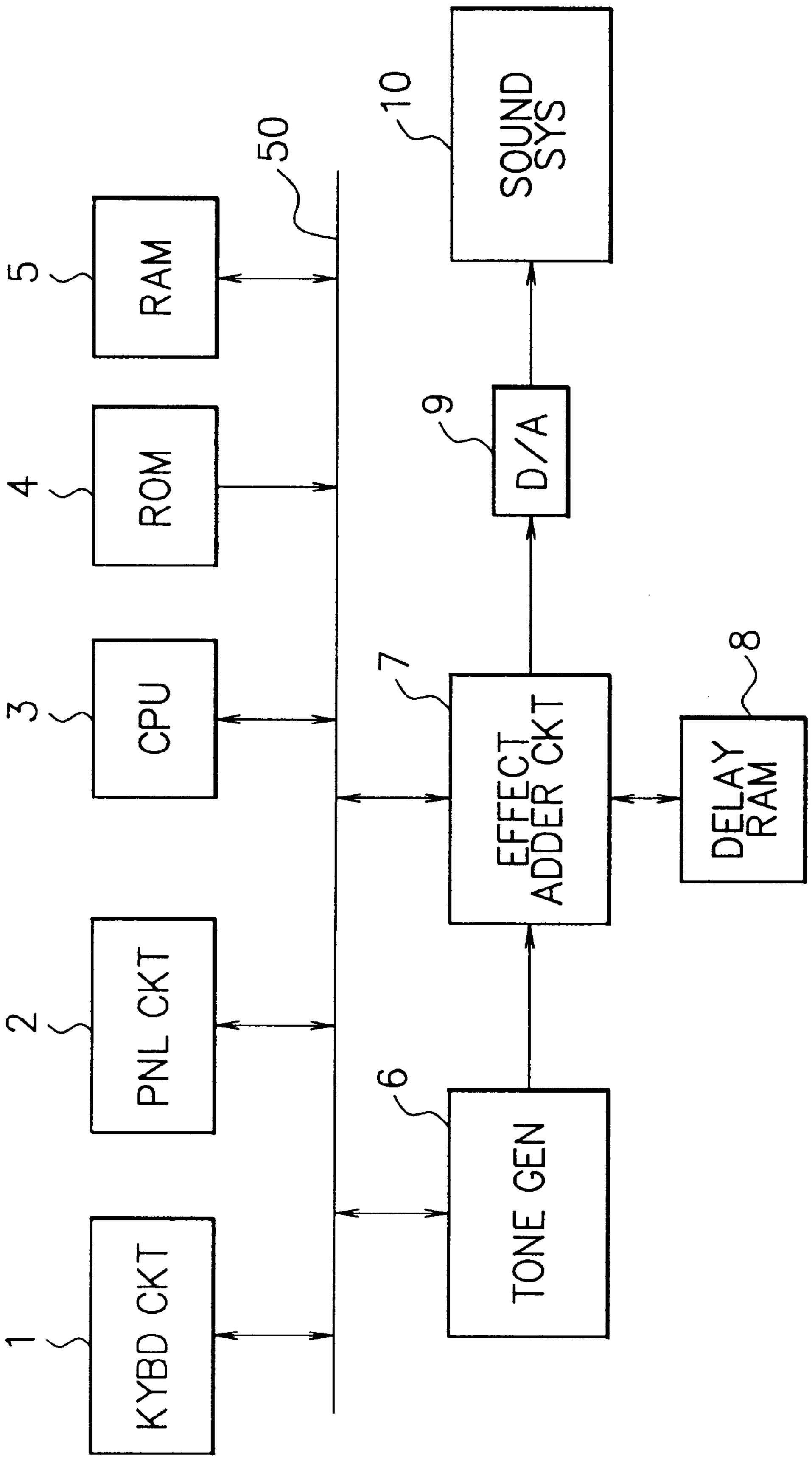
FIG. 2 is a schematic block diagram showing the arrangement of an electronic musical instrument to which the effect adder circuit of the embodiment shown in FIG. 1 is applied.

FIG. 1 is a block diagram showing the internal arrangement of an effect adder circuit according to an embodiment of the present invention, and FIG. 2 is a schematic block diagram showing the arrangement of an electronic musical instrument to which the effect adder circuit shown in FIG. 1 is applied.

Referring to FIG. 2, a keyboard circuit 1, panel circuit 2, CPU 3, ROM 4, RAM 5, tone generator 6, and effect adder circuit 7 are connected to a bus line 50 including a data bus, address bus, and the like, so as to exchange data with each other.

The keyboard circuit 1 has two key switches in correspondence with each of a plurality of keys. The key switches form a matrix circuit via diodes. The panel circuit 2 has various operation members such as a rhythm selection switch, tone color selection switch, effect selection switch, effect addition amount setting switch, tone volume setting switch, and the like, and these switch states are read by the CPU 3 to execute the corresponding processing.

The CPU 3 operates in accordance with a program stored in the ROM 4, and controls the overall electronic musical instrument. For example, the CPU 3 scans the key switches of the keyboard circuit 1 and the operation members of the panel circuit 2 to detect the operation states (ON/OFF key events, key numbers of ON/OFF keys, velocities of key operations, and the like) of the keys of the keyboard circuit 1, and those of the operation members of the panel circuit 2, and executes various kinds of processing (to be described later) in accordance with operations of the keys or operation members.

The ROM 4 stores tone color parameters to be set in the tone generator 6, a microprogram for controlling the operation of the effect adder circuit 7, and the like in addition to the program for determining the operation of the CPU 3. The ROM 4 also stores effect addition coefficients in units of types of effects. The RAM 5 serves as a work memory for the CPU 3, and is used for temporarily storing the processing contents during execution of various kinds of processing by the CPU 3, and storing information obtained as results of various kinds of processing.

The tone generator 6 generates a digital tone signal on the basis of the parameter set by the CPU 3. More specifically, the CPU 3 transfers tone parameters to the tone generator 6 on the basis of the key number of the ON/OFF key, setups of the operation members, and the like. The tone generator 6 generates a tone waveform on the basis of the tone parameters and the like, modifies its (amplitude) envelope, and outputs it as a digital tone signal. In this process, the tone generator 6 time-divisionally generates tone signals for a plurality of channels, adds the signals for all the channels, and outputs the sum signal to the effect adder circuit 7.

The effect adder circuit 7 adds various acoustic effects such as reverberation, chorus, phaser, vibrato, tremolo, and the like to the digital tone signal output from the tone generator 6 by using effect addition coefficients. At this time, the circuit 7 uses a delay RAM 8 connected thereto as a delayer for the tone signal so as to obtain the effect to be added. For example, in order to obtain a reverberation tone, the tone signal must be delayed by several hundred to several ten thousand samples, and the delay RAM 8 is used for implementing this.

The digital tone signal added with the effects by the effect adder circuit 7 is output to a D/A converter 9, and is converted into an analog signal. The analog tone signal obtained by the D/A converter 9 is supplied to a sound system 10 including an amplifier, loudspeaker, and the like, and is acoustically output.

In the internal arrangement of the effect adder circuit 7 shown in FIG. 1, reference numeral 11 denotes a CPU interface circuit, which is used by the CPU 3 when it transfers data to the internal circuits of the effect adder circuit 7. The CPU interface circuit 11 comprises a synchronization circuit for synchronizing data transfer by the CPU 3 with the operation timing of the effect adder circuit 7, and the like.

Reference numeral 12 denotes an input register for temporarily storing the tone signal input from the tone generator 6. Reference numeral 13 denotes an output register for temporarily storing the tone signal to be output to the D/A converter 9. Reference numeral 14 denotes an external memory address control circuit for controlling accesses (data read/write) to the externally connected delay RAM 8. More specifically, the circuit 14 generates an address signal to the delay RAM 8 as an external memory on the basis of offset address information which is transferred and set by the CPU 3 via the CPU interface circuit 11 and is stored in an F-RAM 15.

Reference numeral 16 denotes an external memory read data register for temporarily storing data read out from the delay RAM 8 as an external memory. Reference numeral 17 denotes an external memory write data register for temporarily storing data to be written in the delay RAM 8 as an external memory. A P-RAM 18 stores a microprogram for controlling the operations of the effect adder circuit 7. The contents of the P-RAM 18 are transferred and set by the CPU 3 via the CPU interface circuit 11.

Reference numeral 19 denotes an instruction decoder for decoding instructions of the microprogram read out from the P-RAM 18 via a register 20, and generating signals for controlling the operations of the effect adder circuit 7. For example, the decoder 19 generates selection control signals for various selectors of the internal data bus of the effect adder circuit 7, write enable signals for various pipeline registers, and the like.

A B-RAM 21 is used for temporarily storing data of intermediate results of effect addition operations, and for implementing a delay for to the extent of several samples. Reference numeral 22 denotes a function table ROM which stores the values of a sine function, exponential function, and the like in the form of tables, and is used for effectively implementing nonlinear operations in effect addition. The effect addition is done by a fundamental operation circuit 70 including a multiplier, barrel shifter, adder-subtracter, limiter, selectors, pipeline registers, and the like shown on the right side of the one-dashed chain line in FIG. 1, in addition to the above-mentioned components.

Figure 3:
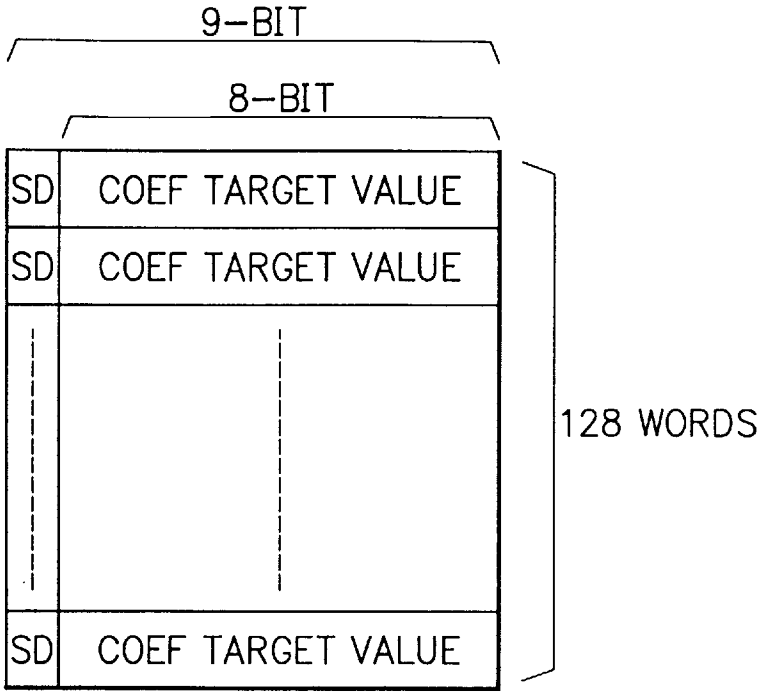
FIG. 3 shows the architecture of a G-RAM.

A G-RAM 23 stores a plurality of words each of which consists of 9 bits and includes an 8-bit coefficient target value and 1-bit smoothing disable flag SD, as shown in FIG. 3 (in the example of FIG. 3, the G-RAM 23 stores 128 words; which are used for generation of different effects). The contents of the G-RAM 23 are obtained by transferring and setting the contents (upper 8 bits of each 16-bit coefficient target value) etc. read out from the ROM 4 by the CPU 3 via the CPU interface circuit 11.

Each 8-bit coefficient target value serves as a target value for smoothly changing a coefficient current value stored in a C-RAM 24 (to be described later), and is supplied to a terminal A of a comparator 25. The 1-bit smoothing disable flag SD disables smoothing of effect addition coefficients when it is “1” and enables smoothing when it is “0”, which is supplied to an OR gate 26. With the above arrangement of the G-RAM 23, whether or not the coefficient is to be smoothed can be set in units of coefficient target values.

As described earlier, some of various effect addition coefficients have fixed values from the very beginning of power ON of the electronic musical instrument, and some other coefficients must be changed upon operation of the effect selection switch or effect addition amount setting switch on the panel circuit 2 or upon operations of various operation members. For example, the smoothing disable flag SD can be set at “1” for the former coefficients, and can be set at “0” for the latter coefficients.

Figure 4:
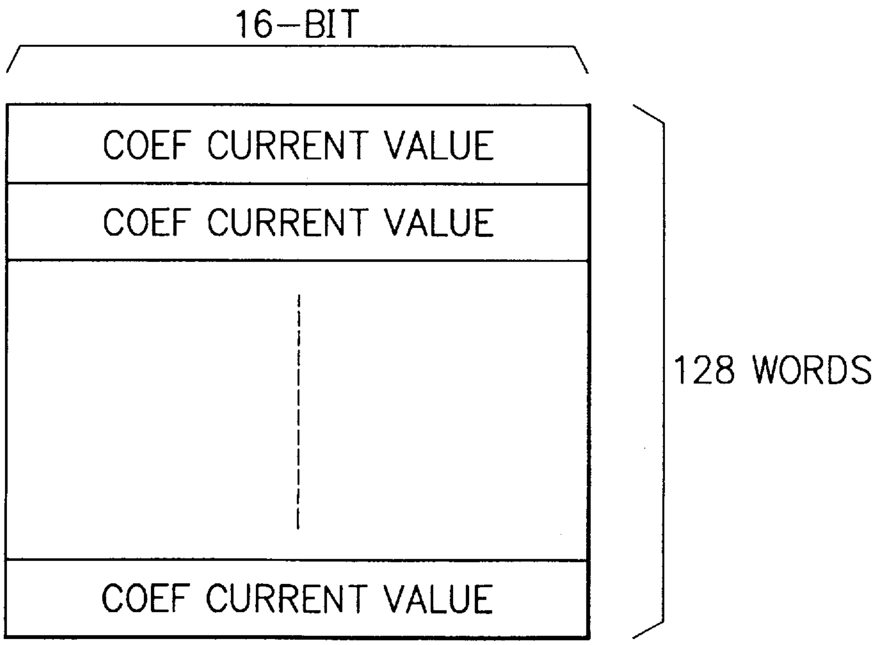
FIG. 4 shows the architecture of a C-RAM.

The above-mentioned C-RAM 24 stores 16-bit coefficient current values for 128 words as in the G-RAM 23, as shown in FIG. 4. When smoothing is enabled, the smoothing result output from the comparator 25, +1/−1 adder 27, or the like is selected by a selector 29, and is stored in the C-RAM 24 via a register 30 and selector 28. On the other hand, when smoothing is denied, the coefficient current value stored in the C-RAM 24 is selected by the selector 29, and is stored again in the C-RAM 24 via the register 30 and selector 28.

When a coefficient is transferred from the CPU 3 via the CPU interface circuit 11, the selector 28 selects the outputs from the CPU interface circuit 11 irrespective of enable/disable of coefficient smoothing. That is, when the coefficient value is transferred from the CPU 3, the selector 28 selects the coefficient value output from the CPU interface 11 in place of the output from the register 30, and stores it in the C-RAM 24.

The coefficient current values stored in the C-RAM 24 are used as multiplication coefficients in digital filter operations, those in amplitude control operations, and the like in effect addition. The address of the C-RAM 24 upon reading out the contents of the C-RAM 24 for effect addition is designated by the microprogram read out from the P-RAM 18. This address designation also designates the address of the G-RAM 23. That is, the same address is designated in effect addition for the G-RAM 23 and C-RAM 24.

The comparator 25 compares an 8-bit coefficient target value input from the G-RAM 23 on its terminal A, and a 16-bit coefficient current value input from the C-RAM 24 on its terminal B so as to smooth the coefficient current value stored in the C-RAM 24 toward the coefficient target value stored in the G-RAM 23. Note that the coefficient target value to be compared is prepared by inserting 8-bit "0"s in the lower 8 bits of the contents of the G-RAM 23 to obtain a 16-bit numerical value.

The comparator 25 outputs a signal "A=B" indicating that the coefficient current value coincides with the coefficient target value or a signal "A>B" indicating that the coefficient target value is larger than the coefficient current value, in accordance with the comparison result. The coincidence signal "A=B" is supplied to the OR gate 26. The signal "A>B" is input to the +1/−1 adder 27 to control its operation. When the coefficient target value is smaller than the coefficient current value, no signal is output (or a signal "0" is output).

The +1−1 adder 27 increments (+1) the coefficient current value read out from the C-RAM 24, and outputs the incremented value to the selector 29 when it receives the signal "A>B" from the comparator 25. On the other hand, the adder 27 decrements (−1) the coefficient current value read out from the C-RAM 24, and outputs the decremented value to the selector 29 when it does not receive the signal "A>B".

The OR gate 26 receives a smoothing disable signal SD' output from the instruction decoder 19 (which generates the signal SD' by decoding an instruction of the microprogram), in addition to the coincidence signal "A=B" from the comparator 25, and the smoothing disable flag SD read out from the G-RAM 23. The OR gate 26 outputs a selection control signal I for controlling the selector 29, which selects and outputs the processing result of the coefficient current value, in accordance with the input contents. The selection control signal I controls enable/disable of smoothing.

More specifically, when at least one of the three input signals is a "1", the OR gate 26 outputs a selection control signal "1" to disable smoothing of the coefficient. At this time, the selector 29 outputs the coefficient current value read out from the C-RAM 24 without any processing. On the other hand, when all the three input signals are "0"s, the OR gate 26 outputs a selection control signal "0" to enable coefficient smoothing. At this time, the selector 29 outputs the intermediate smoothing result data supplied from the +1/−1 adder 27. The value output from the selector 29 is written again in the C-RAM 24 via the register 30 and selector 28.

The operation of the effect adder circuit 7 according to this embodiment with the above arrangement will be explained below. As described above, when the effect selection switch or effect addition amount setting switch on the panel circuit 2 has been operated, or various operation members have been operated, some of effect addition coefficients are changed.

In such a case, the CPU 3 sets the coefficient to be changed in the effect adder circuit 7 with a new value in accordance with the operation amounts and the like of the switches. More specifically, the CPU 3 transfers a new coefficient target value to the location (address) to be changed in the G-RAM 23 via the CPU interface circuit 11. At this time, the CPU 3 sets a "0" as the value of the smoothing disable flag SD corresponding to that new coefficient. Also, in the microprogram instruction that designates the address of that coefficient on the G-RAM 23 and C-RAM 24, coefficient smoothing is enabled by setting a "0" as the value of the smoothing disable signal SD'.

With these setups, the coefficient current value stored in the C-RAM 24 is incremented or decremented one by one by operation of the comparator 25 and +1/−1 adder 27, thereby smoothing the coefficient current value toward the new coefficient target value stored in the G-RAM 23. When the coefficient current value in the C-RAM 24 has reached the new coefficient target value in the G-RAM 23, to complete the smoothing, the comparator 25 outputs a coincidence signal "A=B" to the OR gate 26, thus disabling smoothing.

Consequently, according to this embodiment, when the player changes by panel operations the coefficient value for the effect to be added, the coefficient value is not abruptly changed to a new value but is gradually changed by smoothing. In this case, since a high smoothing resolution is assured by changing the coefficient value with increments or decrements one by one, click noise can be prevented from being produced upon changing the acoustic effects.

In this embodiment, since smoothing is done in the effect adder circuit 7 independent from the CPU 3, the load on the CPU 3 can be reduced. Also, since the smoothing circuit is arranged in addition to the fundamental operation circuits in the effect adder circuit 7, hardware resources for adding effects can be prevented from being occupied by smoothing, resulting in high-quality effect addition.

The circuit scale of the independent smoothing circuit largely depends on the memory capacity for storing coefficients. However, in this embodiment, since the word length of the G-RAM 23 that stores coefficient target values is set to be shorter than that of the coefficient current value used in effect addition, only a few hardware resources need be added for smoothing, and the circuit cost can be reduced.

Unlike in the above embodiment, the circuit scale may be small-sized by limiting the number of words to be stored in the G-RAM 23 that stores coefficient target values to less than that in the C-RAM 24. However, in such case, the coefficient current values cannot have one-to-one correspondence with the coefficient target values, and another complicated circuit is required for arbitration. Therefore, it is preferable to employ the above embodiment that shortens the word length. Note that the word length to be shortened is not limited to 8 bits.

When the word length of each coefficient target value is shortened, the coefficient value after smoothing is determined by the short word length of the target value, resulting in insufficient coefficient precision. However, coefficients that control the amplitude, for example, normally suffice to have 8-bit precision. By contrast, filter coefficients (especially, IIR (Infinite Impulse Response) filter) often require higher precision. In this manner, when the coefficient value to be changed requires 16-bit (9-bit or higher) precision, coefficient smoothing enable and disable are combined.

More specifically, the CPU 3 transfers a coefficient target value with 8-bit precision closest to a new coefficient target value with 16-bit precision to the location (address) to be changed in the G-RAM 23 via the CPU interface circuit 11, in accordance with the switch operation amounts, and the like. At this time, the CPU 3 sets a "0" as the value of the smoothing disable flag SD corresponding to that new 8-bit coefficient target value, thus starting its smoothing. Also, in the microprogram instruction that designates the address of that coefficient on the G-RAM 23 and C-RAM 24, coefficient smoothing is enabled by setting a "0" as the output SD' from the decoder 19.

In this way, the coefficient current value stored in the C-RAM 24 is incremented or decremented one by one upon operation of the comparator 25 or +1/−1 adder 27, thus smoothing the coefficient current value toward the new coefficient target value stored in the G-RAM 23. After an elapse of time expected to be required until completion of smoothing, the value of the smoothing disable flag SD is set at "1" to disable smoothing, and a true coefficient value with 16-bit precision is transferred from the CPU 3 to the corresponding location (address) of the C-RAM 24 via the CPU interface circuit 11.

With this processing, smoothing is done up to the coefficient target value with 8-bit precision, which is close to the final target value, and upon completion of smoothing, the smoothed value is replaced by the true coefficient target value with 16-bit precision. In this case, since the difference between the smoothed value and the true value to be replaced is not so large, click noise is not produced or is nearly negligible if it is produced. Hence, according to this embodiment, production of click noise can be effectively prevented using a smoothing circuit with a small circuit scale, and the effect addition coefficient can be expressed by 16-bit precision that is originally required.

In the above example, smoothing enable/disable is controlled by the value of the smoothing disable flag SD, but may be controlled by the microprogram instruction which designates the address on the G-RAM 23 and C-RAM 24 or these control methods may be combined. Not only for filter coefficients, but also for all other coefficients including amplitude coefficients whose values must be changed, smoothing enable/disable control may be applied.

When smoothing enable/disable control is done by the microprogram instruction which designates the address of a coefficient, the following merits may be expected. More specifically, the microprogram for effect addition is executed at sampling periods around 22 μs, and the address of a single coefficient may often be accessed more than once during one sampling period.

In such case, if smoothing is enabled using the smoothing disable flag SD, since +1/−1 addition is done for each access, coefficient value may change considerably. That is, in each sampling period, the smoothing resolution is low, and the coefficient value changes largely. Hence, when a certain coefficient is accessed frequently, smoothing is enabled by the microprogram in the first access, and is denied in the second and subsequent accesses, thus preventing the above-mentioned shortcomings.

When a coefficient, the value of which need not be changed but which requires high precision, is to be set, the microprogram instruction which designates that coefficient sets the value of the smoothing disable signal SD' at "1", thus disabling coefficient smoothing. The coefficient setup is changed by transferring a coefficient value with 16-bit precision to the corresponding address of the C-RAM 24. At this time, since the G-RAM 23 is not used, any corresponding address contents may be set.

Since such coefficient assumes that it is not changed while a tone is produced, no click noise is produced even if the coefficient to be changed is abruptly changed to a new value. Hence, in such case as well, the effect addition coefficient can be expressed by 16-bit precision that is required essentially without producing any click noise. Note that smoothing may be denied by setting a "1" as the value of the smoothing disable flag SD of the corresponding coefficient.

As described above, by selectively using three patterns, i.e., smoothing, a combination of smoothing enable and smoothing disable, and smoothing disable, any kinds of effect addition coefficients can be smoothed with high resolution using the smoothing circuit with a small circuit scale of this embodiment without increasing the processing load on the CPU 3 or deteriorating the quality of effect addition, thus expressing the coefficients with originally required precision. Note such selective use is done by the CPU 3 via the CPU interface circuit 11 in accordance with the type of effect set on the panel circuit 2.

In the above-mentioned embodiment, two signals, i.e., the smoothing disable flag SD and smoothing disable signal SD' are used for disabling smoothing. However, either one of these signals may be used. When smoothing is denied using the smoothing disable signal SD' based on the microprogram, the above-mentioned merits are expected. On the other hand, when smoothing is disabled using the smoothing disable flag SD, since changes in design that can be hardly attained by the microprogram can be relatively easily made, both the values are preferably used in combination.

According to the present invention, as described above, since smoothing is done in the effect adder device independently of the CPU, the load on the CPU can be reduced, and flexible smoothing can be implemented. In addition, since the coefficient smoothing circuit is implemented in addition to the principal operation circuit in the effect adder apparatus, the operation circuit can be dedicated to effect addition, and high-quality acoustic effects can be added. Furthermore, since the word length of the second storage that stores the coefficient target values is set to be shorter than that of the coefficient current values used in effect addition, only a few hardware resources need only be added for smoothing, resulting in low cost.

According to another feature of the present invention, the smoothing disable circuit that disables coefficient smoothing is provided. The coefficient value set in the first storage that stores the coefficient current value is used as a coefficient, smoothing of which is disabled, without any changes, and the precision of the coefficient can be set by the true word length of the coefficient current value. Since the coefficient current value has a long word length, the coefficient can be expressed with high precision.

What is claimed is:

1. An effect adder apparatus for an electronic musical instrument, comprising:

first storage means for storing coefficient current values used in an effect addition operation;

second storage means for storing coefficient target values each having a word length shorter than a word length of the coefficient current values stored in said first storage means, said second storage means storing a same number of words as in said first storage means;

operation means for implementing the effect addition operation on a generated tone signal by using a coefficient current value stored in said first storage means, the effect addition operation being controlled by a microprogram, addresses of said first and second storage means being designated by the microprogram; and coefficient smoothing means, arranged independently of said operation means, for smoothing a coefficient current value stored in said first storage means toward a coefficient target value stored in said second storage means.

2. The effect adder apparatus according to claim 1, further comprising smoothing disable means for disabling smoothing of coefficient current values by said coefficient smoothing means.

3. The effect adder apparatus according to claim 2, wherein said second storage means further stores disable information for instructing disabling of smoothing in units of coefficients, said smoothing disable means disabling smoothing of a coefficient current value by said coefficient smoothing means when the disable information is active.

4. The effect adder apparatus according to claim 2, wherein said smoothing disable means disables smoothing of a coefficient current value by said coefficient smoothing means in accordance with an instruction of the microprogram when the microprogram designates the addresses of said first and second storage means.

5. The effect adder apparatus according to claim 2, wherein said second storage means further stores disable information for instructing disabling of smoothing in units of coefficients, said smoothing disable means disables smoothing of a coefficient current value by said coefficient smoothing means in accordance with at least one of the disable information in an active state and an instruction of the microprogram when the microprogram designates the addresses of said first and second storage means.

6. The effect adder apparatus according to any one of claims 2 to 5, wherein said smoothing disable means is controlled to disable coefficient smoothing after an elapse of a predetermined period of time from the beginning of coefficient smoothing by said coefficient smoothing means.

7. The effect adder apparatus according to any one of claims 2 to 5, wherein three patterns including enablement of coefficient smoothing, disablement of coefficient smoothing, and a combination of enablement and disablement of coefficient smoothing are selectively used in accordance with a type of coefficient.

8. The effect adder apparatus according to claim 1, wherein said coefficient smoothing means comprises:

detection means for detecting non-coincidence between a coefficient target value and a coefficient current value;

means for forming a smoothed coefficient which is gradually increased or decreased by a given value in a direction to make the coefficient current value coincide with the coefficient target value when non-coincidence is detected;

means for updating the coefficient current value with the smoothed coefficient; and means for sequentially supplying the coefficient current value to said operation means.

9. The effect adder apparatus according to claim 8, wherein the given value is 1.

10. The effect adder apparatus according to claim 1, wherein the word length of the coefficient current values is 16 bits, and the word length of the coefficient target values is 8 bits.

11. The effect adder apparatus according to claim 2, wherein said second storage means comprises a coefficient storage location and a disable information storage location for storing disable information that disables smoothing in units of coefficients, said smoothing disable means disabling smoothing when the disable information is active.

12. The effect adder apparatus according to claim 1, wherein said coefficient smoothing means further comprises smoothing disable means for disabling smoothing of the coefficient current values, said operation means comprising:

storage means for storing the microprogram;

an instruction decoder for decoding the microprogram; and an operation circuit for operating in accordance with an instruction output from said instruction decoder, the microprogram including a smoothing disable instruction, said instruction decoder supplying a decoding output of the smoothing disable instruction to said smoothing disable means.

13. The effect adder apparatus according to claim 1, wherein said coefficient smoothing means further comprises smoothing disable means for disabling smoothing of the coefficient current values, said operation means comprising:

storage means for storing the microprogram;

an instruction decoder for decoding the microprogram; and an operation circuit for operating in accordance with an instruction output from said instruction decoder, the microprogram including a smoothing disable instruction, the coefficient target values having an additional bit indicating disable information for disabling smoothing, said smoothing disable means disabling smoothing based on one of a decoding output of the smoothing disable instruction and the additional bit of a coefficient target value.

14. The effect adder apparatus according to claim 13, wherein said coefficient smoothing means comprises:

means for detecting coincidence/non-coincidence between a coefficient target value and a coefficient current value;

means for forming a smoothed coefficient which is increased or decreased gradually by a given value in a direction to make the coefficient current value coincide with the coefficient target value when non-coincidence is detected;

means for updating the coefficient current value with the smoothed coefficient; and means for supplying a smoothing disable signal to said smoothing disable means when coincidence is detected.

15. The effect adder apparatus according to claim 14, wherein said means for detecting coincidence/non-coincidence detects a near coincidence between the coefficient target value and the coefficient current value, the effect adder apparatus further comprising:

control means for transferring a true coefficient target value having a same word length as the coefficient current value and replacing the coefficient current value by the true coefficient target value upon completion of smoothing.

16. The effect adder apparatus according to claim 13 or 14, wherein said operation means further comprises interface means for transferring the microprogram that includes the coefficient target values from said control means to said storage means.

17. The effect adder apparatus according to claim 6, wherein three patterns including enablement of coefficient smoothing, disablement of coefficient smoothing, and a combination of enablement and disablement of coefficient smoothing are selectively used in accordance with a type of coefficient.

18. The effect adder apparatus of claim 1, wherein said coefficient smoothing means increments a coefficient current value with a set value to provide a smoothed coefficient current value.

19. A method of musical effect addition comprising the steps of:

storing coefficient current values for effect addition operations;

storing coefficient target values each having a word length shorter than a word length of the stored coefficient current values, a number of stored coefficient target values being the same as a number of stored coefficient current values;

smoothing the stored coefficient current values toward the stored coefficient target values; and performing an effect addition operation on a generated tone signal using the smoothed current coefficient values independently of said step of smoothing.

20. The method of musical effect addition of claim 19, wherein said step of smoothing comprises incrementing coefficient current values with a set value to provide smoothed current coefficient values.

21. An effect adder apparatus comprising:

a first storage for storing coefficient current values;

second storage for storing coefficient target values;

a coefficient smoother for smoothing a coefficient current value stored in said first storage toward a coefficient target value stored in said second storage to provide a smoothed coefficient; and an operator for performing an effect addition operation on a generated tone signal using the smoothed coefficient, said coefficient smoother incrementing the coefficient current value by a set value to provide the smoothed coefficient and updating the coefficient current value stored in said first storage with the smoothed coefficient.

22. The effect adder apparatus of claim 21, wherein the coefficient target values stored in said second storage each have a word length shorter than the coefficient current values stored in said first storage.

23. The effect adder apparatus of claim 21, wherein said second storage stores a same number of the coefficient target values as the coefficient current values stored in said first storage.

24. A method of musical effect addition comprising the steps of:

storing coefficient current values;

storing coefficient target values;

smoothing a stored coefficient current value toward a stored coefficient target value to provide a smoothed coefficient; and performing an effect addition operation on a generated tone signal using the smoothed coefficient, said step of smoothing comprising incrementing the coefficient current value by a set value to provide the smoothed coefficient and updating the stored coefficient current value with the smoothed coefficient.

25. The method of musical effect addition of claim 24, wherein the stored coefficient target values each have a word length shorter than the stored coefficient current values.

26. The method of musical effect addition of claim 24, wherein a number of stored coefficient current values and a number of stored coefficient target values are the same.

* * * * *